(12) United States Patent
Yokai et al.

(10) Patent No.: US 7,872,200 B2
(45) Date of Patent: Jan. 18, 2011

(54) WIRED CIRCUIT BOARD AND CONNECTION STRUCTURE BETWEEN WIRED CIRCUIT BOARDS

(75) Inventors: Takahiko Yokai, Osaka (JP); Toshiki Naito, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 642 days.

(21) Appl. No.: 11/717,706

(22) Filed: Mar. 14, 2007

(65) Prior Publication Data
US 2007/0218781 A1 Sep. 20, 2007

(30) Foreign Application Priority Data
Mar. 14, 2006 (JP) .............................. 2006-069516

(51) Int. Cl.
*H05K 1/00* (2006.01)
(52) U.S. Cl. ...................................... 174/254; 361/749
(58) Field of Classification Search ................. 174/254; 361/749–751
See application file for complete search history.

(56) References Cited

U.S. PATENT DOCUMENTS

| 6,399,899 B1 | 6/2002 | Ohkawa et al. |
| 7,286,370 B2 * | 10/2007 | Ooyabu .................... 361/803 |
| 7,348,492 B1 * | 3/2008 | Kawai et al. ................ 174/254 |

FOREIGN PATENT DOCUMENTS

| CN | 1703136 | 11/2005 |
| JP | 2001-209918 | 8/2001 |

* cited by examiner

*Primary Examiner*—Jeremy C Norris
(74) *Attorney, Agent, or Firm*—Jean C. Edwards, Esq.; Akerman Senterfitt

(57) ABSTRACT

A wired circuit board includes a metal supporting layer, an insulating layer formed on the metal supporting layer and a conductive pattern formed on the insulating layer, and having a terminal portion for connecting to an external terminal. The terminal portion is disposed at an end portion of the conductive pattern, supported on the insulating layer, and exposed from the metal supporting layer to have an end surface thereof used as a point of contact with the external terminal.

7 Claims, 8 Drawing Sheets

(a)

(b)

(c)

(d)

(e)

(f)

(g)

(a)

(b)

(a)

(b)

WIRED CIRCUIT BOARD AND CONNECTION STRUCTURE BETWEEN WIRED CIRCUIT BOARDS

CROSS REFERENCE TO RELATED APPLICATION

The present application claims priority from Japanese Patent Application No. 2006-69516 filed on Mar. 14, 2006, the content of which is hereby incorporated by reference into this application.

BACKGROUND OF THE INVENTION

1. Field of the Invention

The present invention relates to a wired circuit board and to a connection structure between wired circuit boards.

2. Description of the Related Art

A wired circuit board used in electronic/electric equipment or the like is typically formed with a terminal portion for connection to an external terminal.

As such terminal portions, so-called flying leads, which are formed not only on one side of a conductive pattern but also on both sides of the conductive pattern, have been prevalent in recent years to be adapted for use in highly-densified and more miniaturized electronic/electric equipment, more specifically, for connection to finer-pitch external terminals.

For example, in a suspension board with circuit used in a hard disk drive or the like, it has been known to form terminal portions as flying leads. Such terminal portions are connected to external terminals by, e.g., applying ultrasonic vibrations by means of a bonding tool or the like (see, e.g., Japanese Unexamined Patent Publication No. 2001-209918).

SUMMARY OF THE INVENTION

However, since both sides of a conductive pattern are exposed at each of such terminal portions formed as flying leads, such terminal portions are low in mechanical strength and may be broken or deformed during the manufacturing or handling thereof, though they are suitable for connection provided by using ultrasonic vibrations. The same shall apply to connecting portions resulting from the connection of the external terminals to the terminal portions.

In addition, in the case where connection is provided between terminal portions and external terminals using molten metal such as, e.g., solder balls, the terminals portions and the external terminals overlap each other to degrade visibility. As a result, alignment between the connecting portions becomes difficult and connection reliability may be degraded occasionally.

It is therefore an object of the present invention to provide a wired circuit board and a connection structure between wired circuit boards which can suppress the degradation of the mechanical strength of each of a terminal portion and the connecting portion between the terminal portion and an external terminal with a simple structure, while improving the connection reliability of the connecting portion, and are also adaptable for highly-densified and more miniaturized electronic/electric equipment.

A wired circuit board according to the present invention comprises a metal supporting layer, an insulating layer formed on the metal supporting layer, and a conductive pattern formed on the insulating layer and having a terminal portion connecting to an external terminal, wherein the terminal portion is disposed at an end portion of the conductive pattern, supported on the insulating layer, and exposed from the metal supporting layer to have an end surface thereof used as a point of contact with the external terminal.

In the wired circuit board according to the present invention, the terminal portion disposed at the end portion of the conductive pattern is exposed from the metal supporting layer and supported on the insulating layer. Accordingly, the mechanical strength of the terminal portion can be enhanced. Since the end surface of the terminal portion is connected as the point of contact with the external terminal, the thickness of the connecting portion can be reduced and the thickness of the entire wired circuit board can be reduced. As a result, it is possible to suppress the degradation of the mechanical strength of the terminal portion with a simple structure, and also provide adaptability to highly-densified and more miniaturized electronic/electric equipment.

In the wired circuit board according to the present invention, it is preferable that the end surface of the terminal portion is substantially flush with an end surface of the insulating layer supporting the terminal portion.

In the connection between the terminal portion and the external terminal, when the end surface of the terminal portion is generally flush with the end surface of the insulating layer, the connecting portion therebetween can be easily visible. As a result, it is possible to easily and precisely connect the terminal portion to the external terminal, and improve the connection reliability of the connecting portion.

In the wired circuit board according to the present invention, it is preferable that the end surface of the terminal portion covers an end surface of the insulating layer supporting the terminal portion.

In the connection between the terminal portion and the external terminal, when the end surface of the insulating layer is covered with the end surface of the terminal portion, the area of the contact point at the terminal portion with the external terminal can be increased without changing the thickness of each of the terminal portion and the insulating layer. As a result, it is possible to easily and precisely connect the terminal portion to the external terminal, and improve the connection reliability of the connecting portion.

Since the wired circuit board according to the present invention is small in thickness at the connecting portion between the terminal portion and the external terminal, and high in connection reliability, it can preferably be used as a suspension board with circuit.

A connection structure between wired circuit boards according to the present invention connects a first wired circuit board to a second wired circuit board, the first wired circuit board comprises a first metal supporting layer, a first insulating layer formed on the first metal supporting layer, and a first conductive pattern formed on the first insulating layer and having a first terminal portion, wherein the first terminal portion is disposed at an end portion of the first conductive pattern, supported on the first insulating layer, and exposed from the first metal supporting layer to have an end surface thereof used as a point of contact, and the second wired circuit board comprises a second insulating layer, and a second conductive pattern formed on the second insulating layer and having a second terminal portion, wherein the first insulating layer of the first wired circuit board is disposed to face the second terminal portion of the second wired circuit board in a direction orthogonal to a layer thickness direction, and the end surface of the first terminal portion of the first wired circuit board is connected to a surface of the second terminal portion of the second wired circuit board via a molten metal.

In the connection structure of a wired circuit board according to the present invention, the first terminal portion disposed at the end portion of the first conductive pattern is exposed from the first metal supporting layer and supported on the first insulating layer. Therefore, in the connection between the first terminal portion and the second terminal portion, the mechanical strength of the connecting portion therebetween can be enhanced. In addition, since the first terminal portion is connected to the second terminal portion with the first insulating layer being disposed to face the second terminal portion in the direction orthogonal to the layer thickness direction, the thickness of the entire connection structure can be reduced. As a result, it is possible to suppress the degradation of the mechanical strength of the connecting portion between the first terminal portion and the second terminal portion with a simple structure, and provide adaptability to highly-densified and more miniaturized electronic/electric equipment.

In the connection structure between wired circuit boards according to the present invention, it is preferable that the end surface of the first terminal portion of the first wired circuit board is substantially flush with an end surface of the first insulating layer supporting the first terminal portion, and the end surface of the first insulating layer of the first wired circuit board is in contact with an end surface of the second terminal portion of the second wired circuit board.

In the connection between the first terminal portion and the second terminal portion, when the end surface of the first terminal portion is substantially flush with the end surface of the first insulating layer, and the end surface of the first insulating is in contact with the end surface of the second terminal portion, the connecting portion therebetween can be easily visible. As a result, it is possible to easily and precisely connect the first terminal portion to the second terminal portion, and improve the connection reliability of the connecting portion therebetween.

In the connection structure between wired circuit boards according to the present invention, it is preferable that the end surface of the first terminal portion of the first wired circuit board covers an end surface of the first insulating layer supporting the first terminal portion, and the end surface of the first terminal portion of the first wired circuit board is in contact with an end surface of the second terminal portion of the second wired circuit board.

In the connection between the first terminal portion and the second terminal portion, when the end surface of the first insulating layer is covered with the end surface of the first terminal portion, and the end surface of the first insulating is in contact with the end surface of the second terminal portion, the area of the contact point with the second terminal portion can be increased without changing the thickness of each of the first terminal portion and the first insulating layer. As a result, it is possible to easily and precisely connect the first terminal portion to the second terminal portion, and improve the connection reliability of the connecting portion therebetween.

In the connection structure between wired circuit boards according to the present invention, it is preferable that the second insulating layer of the second wired circuit board protrudes toward the first metal supporting layer of the first wired circuit board more than the second terminal portion, and the first insulating layer of the first wired circuit board is supported on the second insulating layer of the second wired circuit board.

When the second insulating layer protrudes toward the first metal supporting layer more than the second terminal portion and supporting the first insulating layer, the mechanical strength of the connecting portion between the first terminal portion and the second terminal portion can be enhanced without changing the thickness of each of the first wired circuit board and the second wired circuit board. As a result, it is possible to suppress the degradation of the mechanical strength of the connecting portion between the first terminal portion and the second terminal portion, and provide adaptability to highly-densified and more miniaturized electronic/electric equipment.

Figure 2:
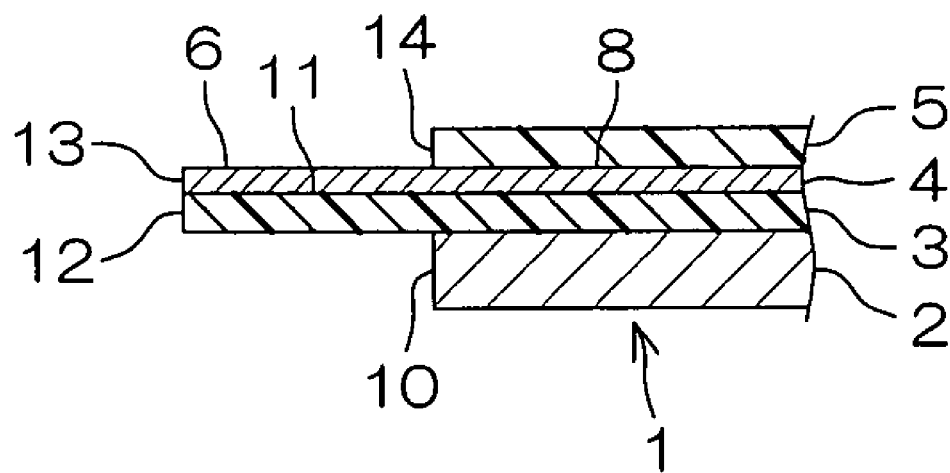
FIG. 2 is an enlarged view of the principal portion of the suspension board with circuit shown in FIG. 1 on which outer terminal portions are formed, 2(a) showing a cross-sectional view along the longitudinal direction of the suspension board with circuit, and 2(b) showing a plan view thereof.
Figure 2:
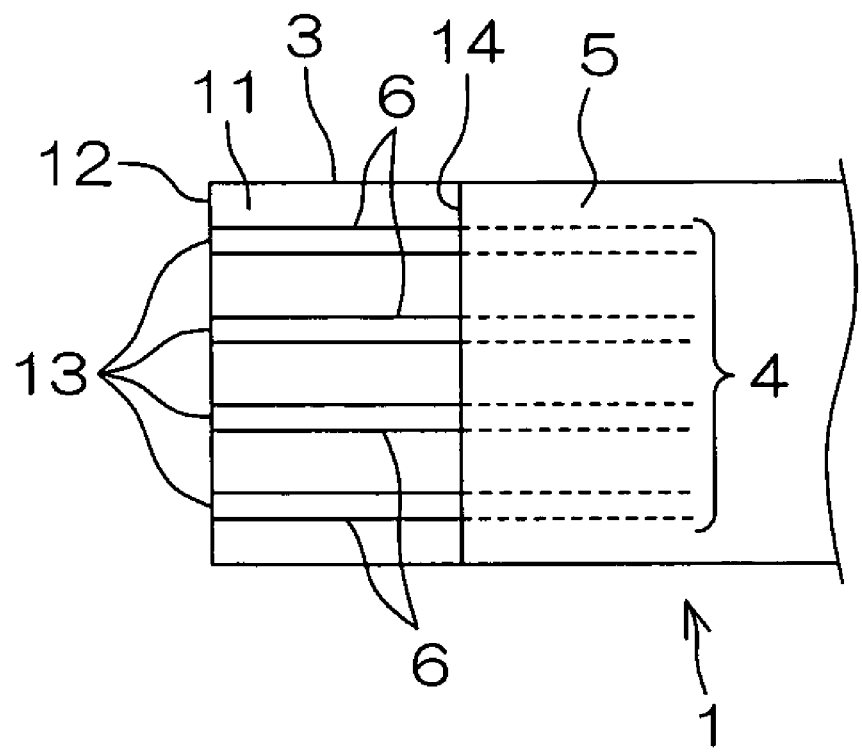
Figure 9:
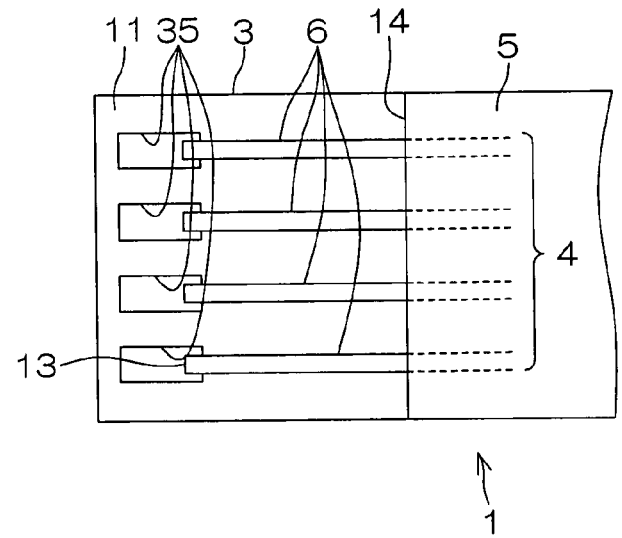
Figure 10:
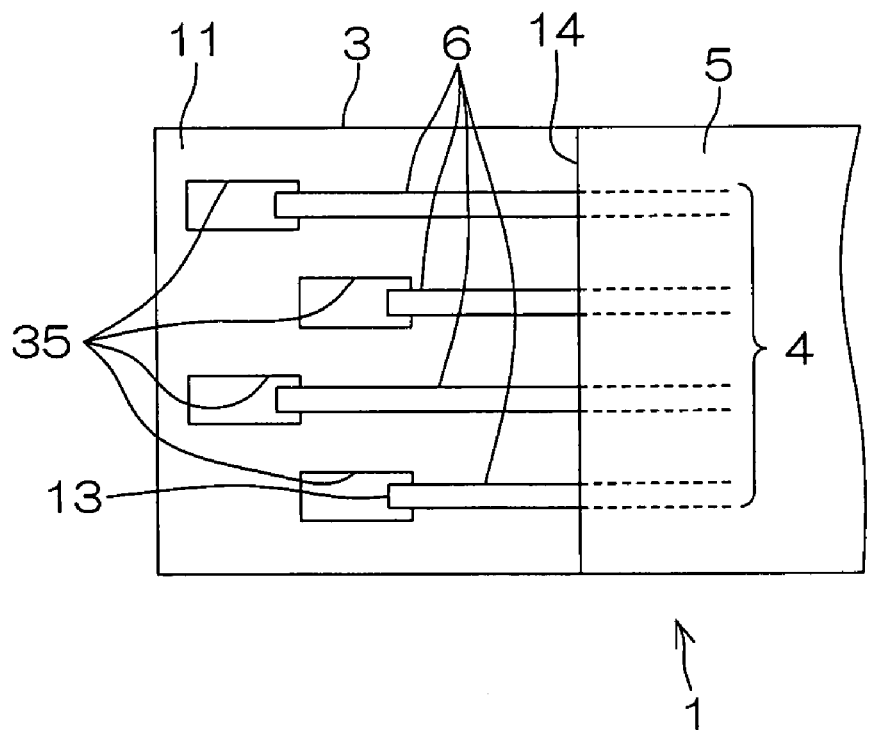
Figure 11:
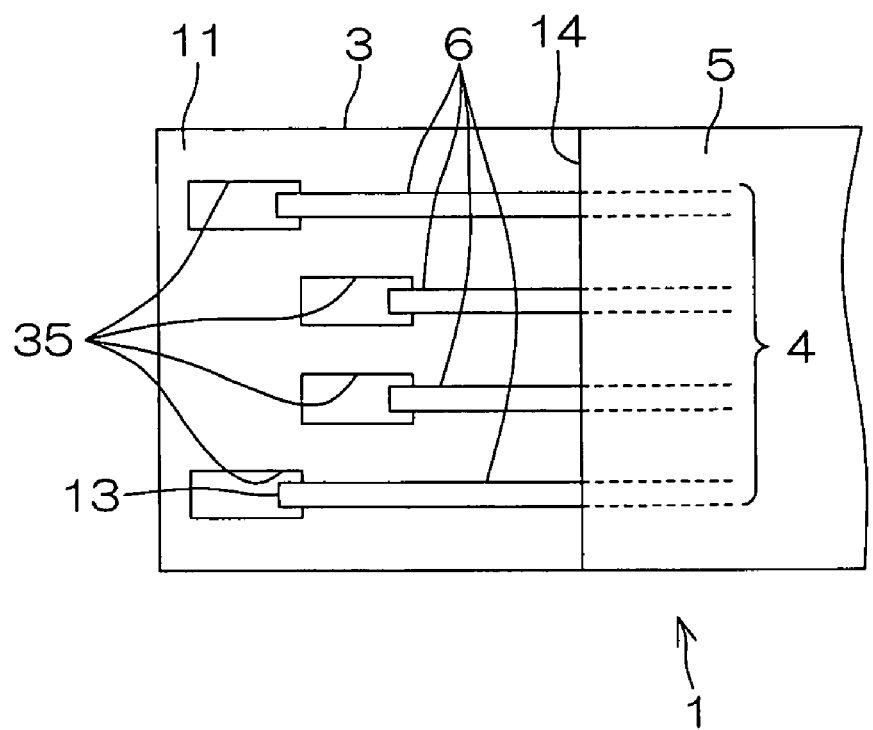

2, showing the principal portion of yet another embodiment (fourth embodiment) of the outer terminal portions shown in FIG. 2;

FIG. 9 is an enlarged plan view correspondent to FIG. 2, showing the principal portion of still another embodiment (fifth embodiment) of the outer terminal portions shown in FIG. 2;

FIG. 10 is an enlarged plan view correspondent to FIG. 2, showing the principal portion of yet another embodiment (sixth embodiment) of the outer terminal portions shown in FIG. 2; and FIG. 11 is an enlarged plan view correspondent to FIG. 2, showing the principal portion of still another embodiment (seventh embodiment) of the outer terminal portions shown in FIG. 2.

DETAILED DESCRIPTION OF THE INVENTION

Figure 1:
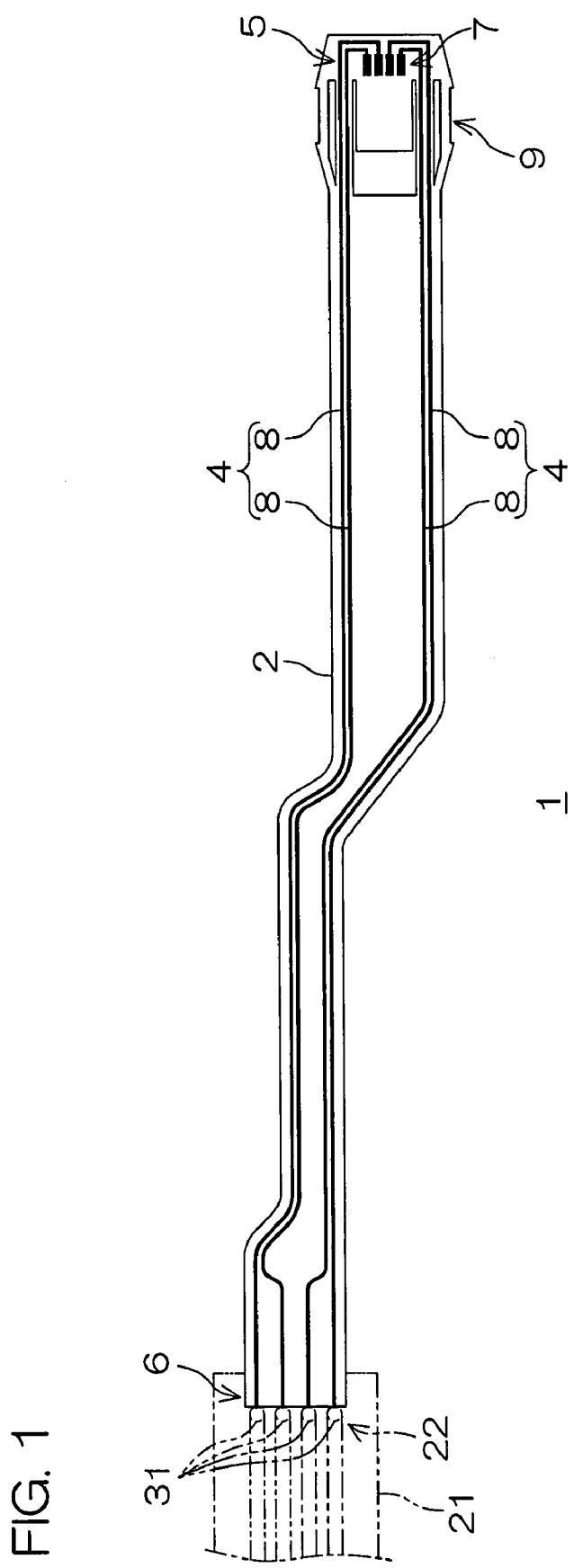
FIG. 1 is a plan view showing an embodiment (first embodiment) of a wired circuit board with circuit according to the present invention.

FIG. 1 is a plan view showing an embodiment (first embodiment) of a suspension board with circuit according to the present invention. FIG. 2 is an enlarged view of the principal portion of the suspension board with circuit shown in FIG. 1 on which outer terminal portions are formed; 2(a) showing a cross-sectional view along the longitudinal direction of the suspension board with circuit, and 2(b) showing a plan view thereof.

In FIG. 1, a suspension board with circuit 1 as a first wired circuit board supports a magnetic head (not shown) of a hard disk drive mounted thereon while holding a minute gap between the magnetic head and the magnetic disk against an air flow caused when the magnetic head and the magnetic disk travel relatively to each other. The suspension board with circuit 1 is formed integrally with a conductive pattern 4 for connecting the magnetic head and an external wired circuit board 21 as a second wired circuit board.

The conductive pattern 4 integrally comprises outer terminal portions 6 each as a first terminal portion disposed at the front end (one end portion in the longitudinal direction) of the suspension board with circuit 1 and connected to an external wired circuit board 21, magnetic-head-side terminal portions 7 each disposed at the rear end portion (the other end portion in the longitudinal direction) of the suspension board with circuit 1 and connected to the magnetic head, and a plurality of (four) wires 8 for mutually connecting between the outer terminal portions 6 and the magnetic-head-side terminal portions 7.

As described later in detail, the plurality of (four) outer terminal portions 6 are provided at the front end portion of the suspension board with circuit 1 in mutually spaced apart relation in a widthwise direction (orthogonal to the longitudinal direction of the suspension board with circuit 1, and hereinafter referred to as such) in correspondence to the plurality of (four) wires 8.

The plurality of (four) magnetic-head-side terminal portions 7 are provided at the rear end portion of the suspension board with circuit 1 in mutually spaced apart relation in the widthwise direction in correspondence to the plurality of (four) wires 8.

As shown in FIG. 2(a), the suspension board with circuit 1 comprises a metal supporting board 2 as a first metal supporting layer extending in the longitudinal direction, a insulating base layer 3 as a first insulating layer formed on the metal supporting board 2, the conductive pattern 4 as a first conductive pattern formed on the insulating base layer 3; and a insulating cover layer 5 formed on the insulating base layer 3 to cover the conductive pattern 4.

In FIG. 1, the insulating base layer 3 and the insulating cover layer 5 are not shown for clear illustration of the conductive pattern 4.

As shown in FIG. 1, the metal supporting board 2 is made of a flat plate formed along a longitudinal direction in a generally cranked shape, such as a metal foil or a metal thin plate.

As shown in FIG. 2, in the metal supporting board 2 a front end portion thereof is formed in a generally rectangular shape when viewed in plan view such that each of the outer terminal portions 6 and the terminal supporting portion 11 are exposed (i.e., such that each of the outer terminal portions 6 and the terminal supporting portion 11 are exposed from a plane of projection in the layer thickness direction of the metal supporting board 2). The front end portion has a front end surface 10 located posterior to each of the outer terminal portions 6 and a terminal supporting portion 11 (described later). The front end surface 10 of the metal supporting board 2 is formed generally flush (linearly shaped when viewed in plan view) along the widthwise direction.

As shown in FIG. 1, the rear end portion of the metal supporting board 2 is formed with a gimbal 9 for mounting the magnetic head anterior to the magnetic-head-side terminal portions 7.

The metal supporting board 2 is made of, e.g., stainless steel, a 42-alloy, copper, a copper alloy, or the like, or preferably made of stainless steel. The thickness of the metal upporting board 2 is in the range of, e.g., 15 to 64 μm, or preferably 18 to 25 μm.

The insulating base layer 3 is formed on a surface of the metal supporting board 2. At the front end portion, the insulating base layer 3 is formed on the area where the external terminals portions 6 are provided. At the rear end portion, the insulating base layer 3 is formed on the area where the magnetic-head-side terminal portions 7 are provided. Between the front end portion and the rear end portion, the insulating base layer 3 is formed on both widthwise sides of the metal supporting board 2 in mutually spaced apart relation.

As shown in FIG. 2, the insulating base layer 3 comprises the terminal supporting portion 11 for supporting the outer terminal portions 6 at the front end portion thereof. The terminal supporting portion 11 is formed to protrude forward from the front end surface of the metal supporting board 2 and to be exposed from the metal supporting board 2.

The terminal supporting portion 11 is formed in a generally rectangular shape having the same width as the metal supporting board 2 when viewed in plan view, and supports the outer terminal portions 6 which are arranged in parallel in the widthwise direction. The front end surface 12 of the terminal supporting portion 11 is formed generally flush surface (linearly shaped when viewed in plan view) along the widthwise direction.

The terminal supporting portion 11 has a length (longitudinal length from the front end surface 10 of the metal supporting board 2 to the front end surface 12 of the terminal supporting portion 11) in the range of, e.g., 0.1 to 5 mm, or preferably 0.5 to 3 mm, and has a width (widthwise length) in the range of, e.g., 0.2 to 5 mm, or preferably 0.3 to 2 mm.

The insulating base layer 3 is formed of a synthetic resin such as, e.g., polyimide, polyethernitrile, polyethersulfone, polyethylene terephthalate, polyethylene naphthalate, or polyvinyl chloride, or preferably formed of polyimide. The insulating base layer 3 has a thickness in the range of, e.g., 6 to 15 μm, or preferably 8 to 12 μm.

The conductive pattern 4 is formed on a surface of the insulating base layer 3, and comprises the plurality of wires 8, the outer terminal portions 6 corresponding to the respective wires 8, and the magnetic-head-side terminal portions 7 corresponding to the respective wires 8, as stated previously.

The individual wires 8 are arranged in parallel in mutually spaced apart relation in the widthwise direction. More specifically, the wires 8 are provided in pairs extending in the longitudinal direction such that the pairs are arranged in parallel in mutually spaced apart relation in the widthwise direction. The two pairs of wires 8 are provided individually on the respective surfaces of the insulating base layer 3 which are formed on both widthwise sides in mutually spaced apart relation.

The wires 8 are formed to continue to the respective outer terminal portions 6 at the front end portion, and to the respective magnetic-head-side terminal portions 7 at the rear end portion.

As shown in FIG. 2, each of the outer terminal portions 6 is provided on the terminal supporting portion 11 of the insulating base layer 3 which is exposed from the front end surface 10 of the metal supporting board 2. More specifically, the respective outer terminal portions 6 are provided continuously from the respective wires 8 to extend forward from the front end surface 10 of the metal supporting board 2 such that the front end surfaces 13 thereof are substantially flush with the front end surface 12 of the terminal supporting portion 11. In other words, when viewed in plan view, the front end surface 13 of each of the external terminals portions 6 overlaps the front end surface 12 of the terminal support portion 11 on the same straight line extending in the widthwise direction.

As a result, the outer terminal portions 6 are exposed from the front end surface 10 of the metal supporting board 2, and supported on the terminal supporting portion 11 of the insulating base layer 3 in mutually spaced apart relation in the widthwise direction.

The outer terminal portions 6 have the respective front end surfaces 13 thereof used as contact points for connecting with connecting terminal portions 22 each as the second terminal portion of the external wired circuit board 21.

Each of the outer terminal portions 6 has a length (longitudinal length) equal to that of the terminal supporting portion 11, and has a width equal to or larger than that of each of the wires 8. The width of each of the outer terminal portions 6 is in the range of, e.g., 15 to 150 µm, or preferably 20 to 100 µm. The widthwise spacing between the individual outer terminal portions 6 is in the range of, e.g., 15 to 150 µm, or preferably 20 to 50 µm.

At the rear end portion, each of the magnetic-head-side terminal portions 7 is formed as a land wider than each of the wires 8.

The conductive pattern 4 is made of a metal such as, e.g., copper, nickel, gold, a solder, or an alloy thereof, or preferably formed of copper. The conductive pattern 4 has a thickness in the range of, e.g., 3 to 30 µm, or preferably 8 to 15 µm.

The insulating cover layer 5 is formed on a surface of the insulating base layer 3 to cover the plurality of wires 8. The front end portion of the insulating cover layer 5 is formed on the surface of the insulating base layer 3 such that each of the outer terminal portions 6 and the terminal supporting portion 11 is exposed.

The insulating cover layer 5 has a front end portion formed in a generally rectangular shape when viewed in plan view, which is the same as the shape of the metal supporting board 2. The front end surface 14 of the insulating cover layer 5 is formed to be located posterior to each of the outer terminal portions 6 and the terminal supporting portion 11 such that each of the outer terminal portions 6 and the terminal supporting portion 11 is exposed. The front end surface 14 of the insulating cover layer 5 is formed generally flush (linear when viewed in plan view) along the widthwise direction.

More specifically, the front end surface 14 of the insulating cover layer 5 is formed to be generally flush with the front end surface 10 of the metal supporting board 2. In other words, when viewed in plan view, the front end surface 14 of the insulating cover layer 5 overlaps the front end surface 10 of the metal supporting board 2 on the same straight line extending along the widthwise direction.

On the other hand, the rear end portion of the insulating cover layer 5 is formed on the surface of the insulating base layer 3 such that each of the magnetic-head-side terminal portions 7 is exposed.

The portion of the insulating cover layer 5 between the front end portion and the rear end portion is formed over the respective surfaces of the insulating base layer 3 which are formed on both widthwise sides in mutually spaced apart relation in such a manner as to cover each of the wires 8.

The insulating cover layer 5 is formed of any of the synthetic resins shown by way of example for the insulating base layer 3, or preferably formed of polyimide. The insulating cover layer 5 has a thickness in the range of 1.5 to 7 µm, or preferably 3 to 5 µm.

Figure 3:
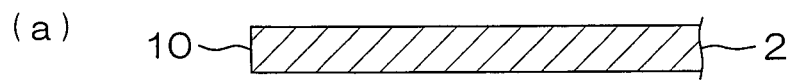
FIG. 3 is a view illustrating an embodiment of a method for manufacturing the suspension board with circuit shown in FIG. 1, 3(a) showing the step of preparing a metal supporting board, 3(b) showing the step of forming a insulating base layer on a surface of the metal supporting board, 3(c) showing the step of forming a plating resist in a pattern reverse to a conductive pattern on the insulating base layer, 3(d) showing the step of forming a conductive pattern on the insulating base layer exposed from the plating resist, 3(e) showing the step of removing the plating resist and a portion of a metal thin film on which the plating resist is formed, 3(f) showing the step of forming a insulating cover layer on a surface of the insulating base layer such that each of wires is covered therewith, and 3(g) showing the step of removing the metal supporting board such that each of the outer terminal portions and a terminal supporting portion are exposed from the metal supporting board.
Figure 3:
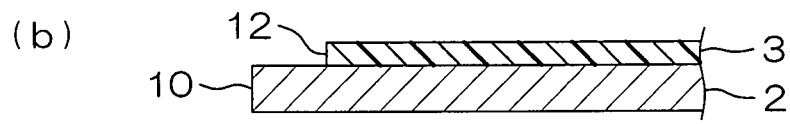
Figure 3:
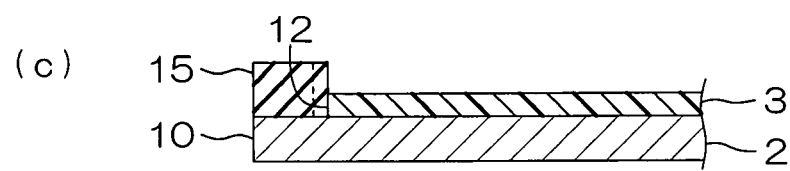
Figure 3:
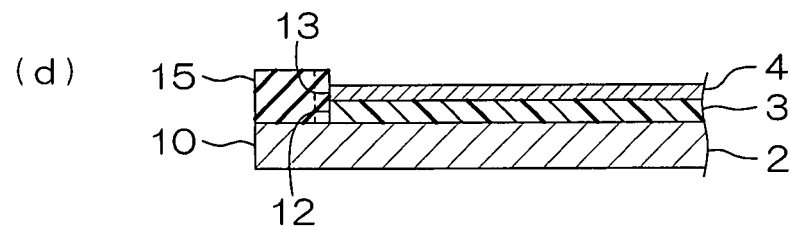
Figure 3:
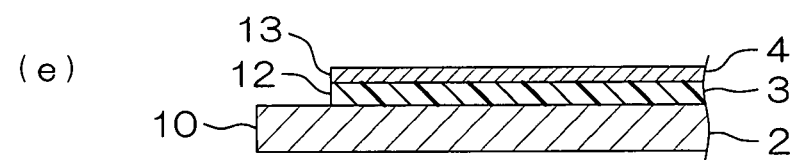
Figure 3:
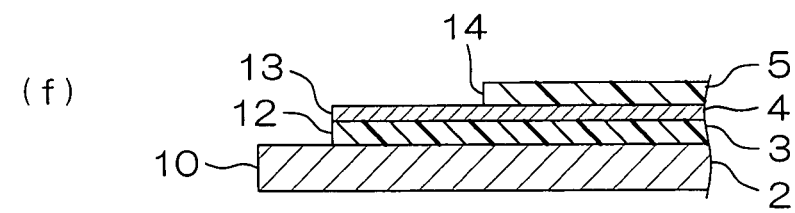
Figure 3:
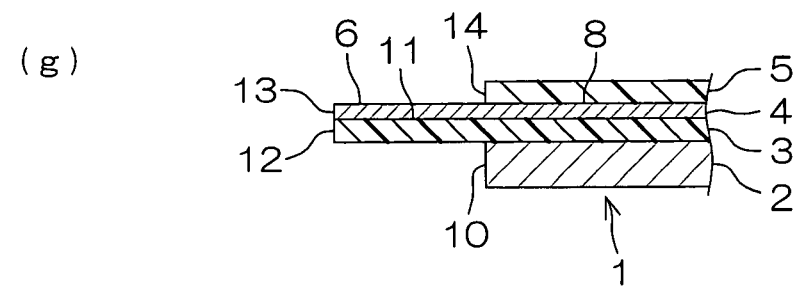

FIG. 3 is a view illustrating an embodiment of a method for manufacturing the suspension board with circuit 1 shown in FIG. 1.

Referring to FIG. 3, a description is given to the method for manufacturing the suspension board with circuit 1. FIG. 3 is shown as a cross-sectional view corresponding to FIG. 2(a).

In accordance with the method, the metal supporting board 2 is prepared first, as shown in FIG. 3(a). Then, as shown in FIG. 3(b), the insulating base layer 3 is formed in the pattern described above on the surface of the metal supporting board 2.

To form the insulating base layer 3 on the surface of the metal supporting board 2, a resin solution, e.g., is coated on the surface of the metal supporting board 2, dried, and then heated to be cured.

The resin solution is prepared by dissolving the resin shown above in an organic solvent, or the like. As the resin solution, e.g., a polyamic acid resin solution (varnish), which is a precursor of polyimide, or the like is used.

For the coating of the resin solution, a known coating method such as a doctor blade method, or a spin coating method is used. After the resin solution is dried appropriately by heating, it is further heated at a temperature of not less than 250° C. to be cured so that the insulating base layer 3 made of a flexible resin film is formed in the pattern described above on the surface of the metal supporting board 2.

By compounding a photosensitive agent in the resin solution, coating the resin solution, exposing the coated resin solution to light, and developing it, the insulating base layer 3 can be formed easily in the pattern described above.

The insulating base layer 3 can also be formed by bonding a resin film formed preliminarily in the pattern described above to the metal supporting board 2 via an adhesive agent as necessary.

Then, in accordance with the method, the conductive pattern 4 is formed as described above in the pattern comprising the outer terminal portions 6, the magnetic-head-side terminal portions 7, and the wires 8 on the surface of the insulating base layer 3, as shown in FIGS. 3(c) to 3(e). The conductive pattern 4 is formed on the surface of the insulating base layer 3 by a known patterning method such as a subtractive method or an additive method. Of these patterning methods, the additive method is preferably used in terms of enabling the formation of the conductive pattern 4 with a fine pitch.

Specifically, the additive method first forms a conductive thin film, e.g., a copper thin film or chromium thin film (not shown) over the entire surface of the insulating base layer 3 by a known method such as a vacuum vapor deposition method or a sputter deposition method.

Then, a plating resist 15 is formed in the pattern reverse to the conductive pattern 4 on the insulating base layer 3 (conductive thin film). The plating resist 15 is formed as a resist pattern by a known method using, e.g., a dry film resist, or the like. As shown in FIG. 3(*c*), the plating resist 15 is formed also on the metal supporting board 2.

Then, as shown in FIG. 3(*d*), the conductive pattern 4 is formed by electrolytic plating in the pattern described above on the insulating base layer 3 (conductive thin film) exposed from the plating resist 15. As electrolytic plating, electrolytic copper plating is used preferably.

Then, as shown in FIG. 3(*e*), the plating resist 15 and the portion of the metal thin films on which the plating resist 15 is formed are removed by, e.g., etching such as chemical etching (wet etching) or peeling them off. As a result, the conductive pattern 4 is formed in the pattern described above.

Thereafter, in accordance with the method, the insulating cover layer 5 is formed on the surface of the insulating base layer 3 to cover each of the wires 8, as shown in FIG. 3(*f*).

To form the insulating cover layer 5 on the surface of the insulating base layer 3, a resin solution, e.g., preferably a polyamic acid resin solution is coated on the surface of the insulating base layer 3, dried, and then heated to be cured in the same manner as in the formation of the insulating base layer 3.

By compounding a photosensitive agent in the resin solution, coating the resin solution, exposing the coated resin solution to light, and developing it, the insulating cover layer 5 can also be formed easily in the pattern described above in the same manner as the insulating base layer 3.

The insulating cover layer 5 can also be formed by bonding a resin film formed preliminarily in the pattern described above to the insulating base layer 3 via an adhesive agent as necessary.

As a result, the insulating cover layer 5 is formed to have the front end surface thereof 14 located posterior to each of the outer terminal portions 6 and the terminal supporting portion 11.

Then, in accordance with the method, the metal supporting board 2 is removed by etching such as chemical etching (wet etching) such that each of the outer terminal portions 6 and the terminal supporting portion 11 is exposed from the metal supporting board 2, as shown in FIG. 3(*g*). By the etching, the gimbal 9 is also formed.

As a result of the etching, the front end surface 10 of the metal supporting board 2 is located posterior to each of the outer terminal portions 6 and the terminal supporting portion 11, as described above.

Thereafter, a metal plating layer is formed on each of the outer terminal portions 6 and the magnetic-head-side terminal portions 7 which are exposed from the insulating cover layer 5 as necessary, though it is not illustrated, whereby the suspension board with circuit 1 is obtained.

The metal plating layer is formed on, e.g., the surface of each the outer terminal portions 6 and the magnetic-head-side terminal portions 7 by electrolytic plating (electrolytic gold plating or electrolytic nickel plating).

In the suspension board with circuit 1 thus obtained, the outer terminal portions 6 are exposed from the metal supporting board 2 and supported on the terminal supporting portion 11. Accordingly, the mechanical strength of each of the outer terminal portions 6 in the layer thickness direction can be enhanced. This improves rigidity and thereby allows effective prevention of the breakage or deformation of the outer terminal portions 6 during the production and transportation thereof.

In addition, the front end surfaces 13 of the outer terminal portions 6 are used as contact points for connecting with the connecting terminal portions 22 of the external wired circuit board 21. As a result, the thicknesses of the connecting portions with the external wired circuit board 21 (connecting portions between the connecting terminal portions 22 of the external wired circuit board 21 and the outer terminal portions 6 of the suspension board with circuit 1 via molten solder balls 31, which is hereinafter referred to as such) can be reduced, whereby, the thickness of the entire suspension board with circuit 1 can be reduced.

As a result, the suspension board with circuit 1 can suppress the degradation of the mechanical strength of each of the outer terminal portions 6 with a simple structure, and is also adaptable for use in highly-densified and more miniaturized electronic/electric equipment.

Moreover, in the suspension board with circuit 1, the front end surface 13 of each of the outer terminal portions 6 is formed to be generally flush with the front end surface 12 of the terminal supporting portion 11. This allows easy visual inspection of the connecting portions between the outer terminal portions 6 and the connecting terminal portions 22 of the external wired circuit board 21 from the outside, as described later. As a result, it is possible to easily align the outer terminal portions 6 with the connecting terminal portions 22 of the external wired circuit board 21, and precisely connect the connecting portions therebetween, thereby improving the connection reliability of the connecting portions.

Figure 4:
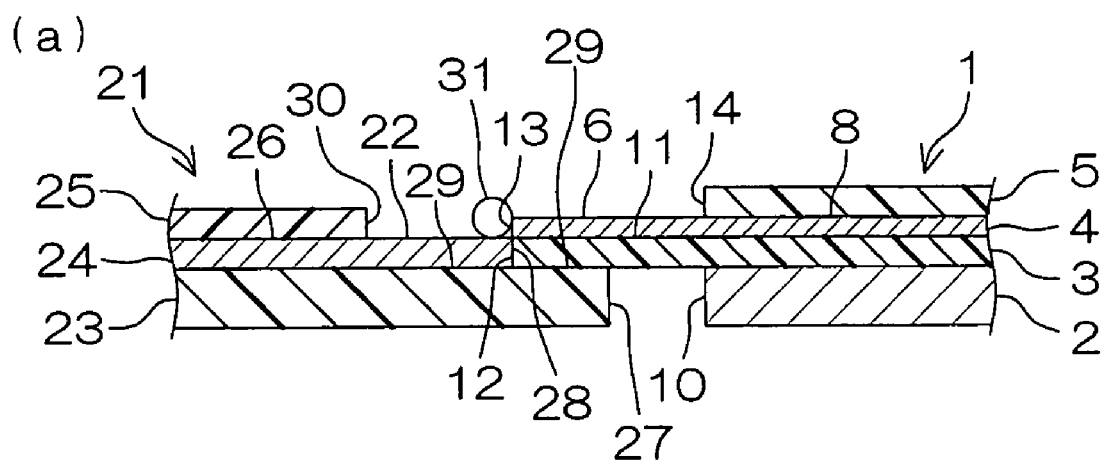
FIG. 4 is a cross-sectional view showing the principal portion of a connection structure between each of the outer terminal portions of the suspension board with circuit shown in FIG. 1, and each of the connecting terminal portions of an external wired circuit board, 4(a) showing a cross-sectional view along the longitudinal direction of the suspension board with circuit, and 4(b) showing a plan view thereof.
Figure 4:
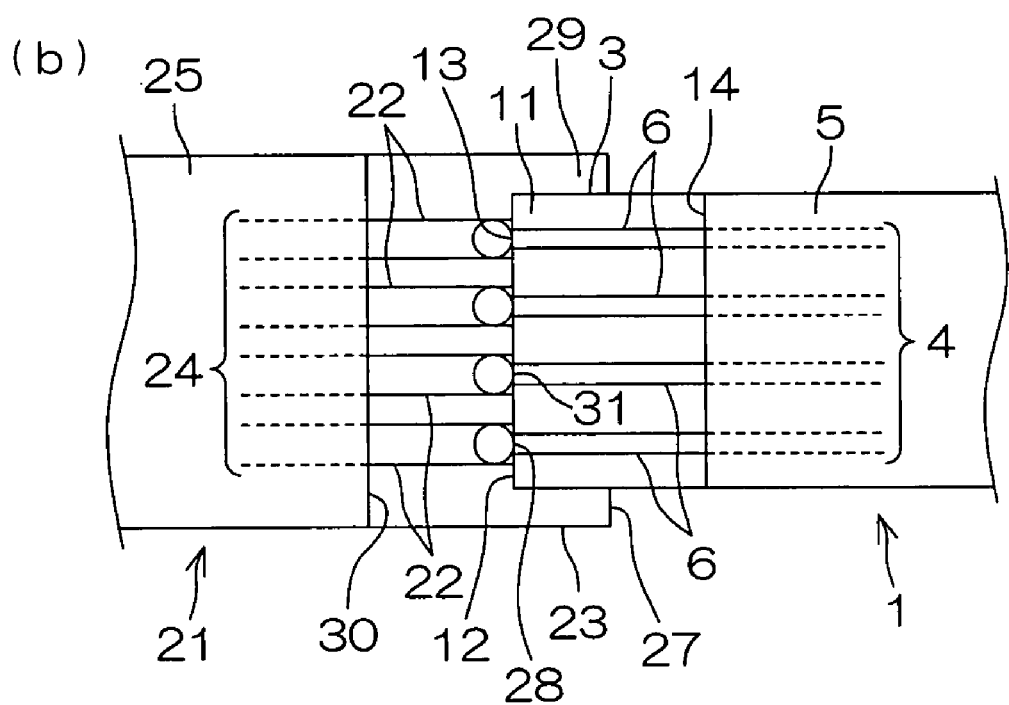

FIG. 4 is a cross-sectional view showing the principal portion of a connection structure between each of the outer terminal portions of the suspension board with circuit shown in FIG. 1 and each of the connecting terminal portions of the external wired circuit board, 4(*a*) showing a cross-sectional view along the longitudinal direction of the suspension board with circuit, and 4(*b*) showing a plan view thereof.

Next, referring to FIG. 4, a description is given to the connection structure between each of the outer terminal portions 6 of the suspension board with circuit 1 and each of the connecting terminal portions 22 of the external wired circuit board 21.

In FIG. 4, the external wired circuit board 21 is a relay flexible board or a control flexible board to be electrically connected to the suspension board with circuit 1, and comprises a insulating base layer 23 as a second insulating layer, a conductive pattern 24 as a second conductive pattern formed on the insulating base layer 23, and a insulating cover layer 25 formed on the insulating base layer 23 to cover the conductive pattern 24.

In the following description, for clear distinction between the suspension board with circuit 1 and the external wired circuit board 21, each of the members of the suspension board with circuit 1 is denoted by a name followed by (on the S side) additionally, while each of the members of the external wired circuit board 21 is denoted by a name followed by (on the X side) additionally.

The insulating base layer 23 (on the X side) is made of a flat plate wider than the insulating base layer 3 (on the S side), and extending in the longitudinal direction. The insulating base layer 23 (on the X side) is formed of, e.g., any of the synthetic resins shown by way of example for the insulating base layer 3 (on the S side), or preferably formed of polyimide. The insulating base layer 23 has a thickness in the range of, e.g., 5 to 35 μm, or preferably 10 to 25 μm.

The portion of the insulating base layer 23 (on the X side) which longitudinally spans between the rear end surface 27 thereof and the rear end surface 28 of each of the connecting terminal portions 22, which is described next, is provided as a supporting portion 29 for supporting the insulating base layer 3 (on the S side). The supporting portion 29 is formed in a generally rectangular shape wider than the insulating base layer 3 (on the S side) when viewed in plan view. The supporting portion 29 has a length (longitudinal length) in the range of, e.g., 0.1 to 5 mm, or preferably 0.5 to 3 mm, and has a width (widthwise length) in the range of, e.g., 0.1 to 30 mm, or preferably 1 to 15 mm.

The conductive pattern 24 (on the X side) is formed on a surface of the insulating base layer 23 (on the X side), and comprises a plurality of wires 26, and the connecting terminal portions 22 as external terminals corresponding to the respective wires 26. The conductive pattern 24 (on the X side) also comprises terminal portions for connection with various electronic components and various wired circuit boards on the side longitudinally opposite to the connecting terminal portions 22, though they are not shown.

The respective wires 26 are provided to extend in the longitudinal direction, and arranged in parallel in mutually spaced apart relation in the widthwise direction. The respective wires 26 are formed to be continued to the respective connecting terminal portions 22 at the rear end portion (one end portion in the longitudinal direction).

The respective connecting terminal portions 22 are provided in mutually spaced apart relation along the widthwise direction at the rear end portion of the insulating base layer 23 (on the X side) to extend continuously from the respective wires 26, while having the rear end surfaces 28 thereof located anterior to the rear end surface 27 of the insulating base layer 23 (on the X side).

Each of the connecting terminal portions 22 has a length (longitudinal length from the rear end surface 30 of the insulating cover layer 25 (on the X side), which is described later, to the rear end surface 28 of the connecting terminal portion 22) in the range of, e.g., 0.5 to 5 mm, or preferably 0.2 to 2 mm. Each of the connecting terminal portions 22 has a width (widthwise dimension) equal to or larger than that of each of the wires 26, which is in the range of, e.g., 15 to 150 μm, or preferably 20 to 100 μm. The widthwise spacing between the individual connecting terminal portions 22 is in the range of, e.g., 15 to 150 μm, or preferably 20 to 50 μm.

The respective connecting terminal portions 22 are provided corresponding to the respective outer terminal portions 6 (on the S side) and formed to have widths and spacings therebetween which allow the connecting terminal portions 22 to face the respective outer terminal portions 6 (on the S side) in the longitudinal direction.

The conductive pattern 24 (on the X side) is formed of any of the metals shown by way of example for the conductive pattern 4 (on the S side), or preferably formed of copper. The conductive pattern 24 has a thickness in the range of, e.g., 6 to 70 μm, or preferably 8 to 20 μm.

The insulating cover layer 25 (on the X side) is formed on the surface of the insulating base layer 23 (on the X side) to cover the plurality of wires 26. The insulating cover layer 25 (on the X side) has a rear end surface 30 thereof located anterior to each of the connecting terminal portions 22 such that each of the connecting terminal portions 22, the insulating base layer 23 and the supporting portion 29, both which support the connecting terminal portions 22, are exposed. The rear end surface 30 of the insulating cover layer 25 is formed as generally flush (linearly shaped when viewed in plan view) in the widthwise direction.

The insulating cover layer 25 (on the X side) is formed of any of the synthetic resins shown by way of example for the insulating base layer 3 (on the S side), or preferably formed of polyimide. The insulating cover layer 25 has a thickness in the range of, e.g., 5 to 35 μm, or preferably 10 to 25 μm.

The external wired circuit board 21 is formed in accordance with the suspension board with circuit 1 described above, or with a known method.

In the connection structure, the terminal supporting portion 11 of the suspension board with circuit 1 and the connecting terminal portions 22 of the external wired circuit board 21 are disposed to face each other in the longitudinal direction (in the direction orthogonal to the layer thickness direction) with the outer terminal portions 6 being aligned to longitudinally overlap the connecting terminal portions 22, as shown in FIG. 4(a). As a result, the front end surface 12 of the terminal supporting portion 11 and the rear end surface 28 of each of the connecting terminal portions 22 are brought into contact with each other in abutting relation.

The supporting portion 29 of the external wired circuit board 21 is disposed to face the metal supporting board 2 of the suspension board with circuit 1 in the longitudinal direction. The supporting portion 29 is positioned protrude toward the front end surface 10 of the metal supporting board 2 more than each of the connecting terminal portions 22. The terminal supporting portion 11 of the suspension board with circuit 1 is placed and supported on the supporting portion 29.

On the respective rear end portions of the connecting terminal portions 22, solder balls 31 as molten metal are provided to contact both with the respective surfaces of the connecting terminal portions 22 and with the respective front end surfaces 13 of the outer terminal portions 6. For descriptive purpose, FIG. 4 shows the solder balls 31 in a pre-molten state. In an actual situation, however, the solder balls 31 are in molten.

In this manner, in the connection structure, the respective connecting terminal portions 22 of the external wired circuit board 21 are electrically connected to the respective outer terminal portions 6 of the suspension board with circuit 1 via the solder balls 31.

The solder balls 31 are provided as follows. After the external wired circuit board 21 and the suspension board with circuit 1 are arranged as described above, the solder balls 31 are placed on the respective rear end portions of the connecting terminal portions 22 and heated to be molten, thereby coming into contact with the respective surfaces of the connecting terminal portions 22 and with the respective front end surfaces 13 of the outer terminal portions 6.

In such a connection structure, the outer terminal portions 6 of the suspension board with circuit 1 are exposed from the metal supporting board 2 and supported on the terminal supporting portion 11. This allows the mechanical strength of each of the outer terminal portions 6 in the layer thickness direction to be enhanced. As a result, it is possible to effectively prevent the breakage or deformation of the outer terminal portions 6 during the production and transportation thereof.

Since the respective surfaces of the connecting terminal portions 22 are connected to the respective front end surfaces 13 of the outer terminal portions 6 via the solder balls 31 with the terminal supporting portion 11 of the suspension board with circuit 1 being disposed to face each of the connecting terminal portions 22 of the external wired circuit board 21 in the longitudinal direction, the thickness of the entire connection structure can be reduced. As a result, it is possible to suppress the degradation of the mechanical strength of each of the connecting portions between the connecting terminal portions 22 and the outer terminal portions 6 with a simple structure and provide adaptability to highly-densified and more miniaturized electronic/electric equipment.

In addition, in the connection structure, the front end surface 13 of each of the outer terminal portions 6 of the suspension board with circuit 1 is formed to be generally flush with the front end surface 12 of the terminal supporting portion 11 thereof, and the front end surface 12 of the terminal supporting portion 11 are brought into contact with the rear end surface 28 of each of the connecting terminal portions 22 of the external wired circuit board 21. Therefore, in the connection between the respective front end surfaces 13 of the outer terminal portions 6 and the respective surfaces of the connecting terminal portions 22 via the solder balls 31, the connecting portions therebetween can be easily visually inspected from the outside. This makes it possible to precisely connect the individual outer terminal portions 6 to the individual connecting terminal portions 22 through easy alignment, and improve the connection reliability of the connecting portions.

Moreover, in the connection structure, the terminal supporting portion 11 of the suspension board with circuit 1 is placed and supported on the supporting portion 29. Accordingly, the mechanical strength of each of the connecting portions between the respective outer terminal portions 6 and the respective connecting terminal portions 22 can be enhanced without changing the thicknesses of the suspension board with circuit 1 and the external wired circuit board 21. As a result, it is possible to suppress the degradation of the mechanical strength of each of the connecting portions between the outer terminal portions 6 and the connecting terminal portions 22 and provide adaptability to highly-densified and more miniaturized electronic/electric equipment.

Figure 5:
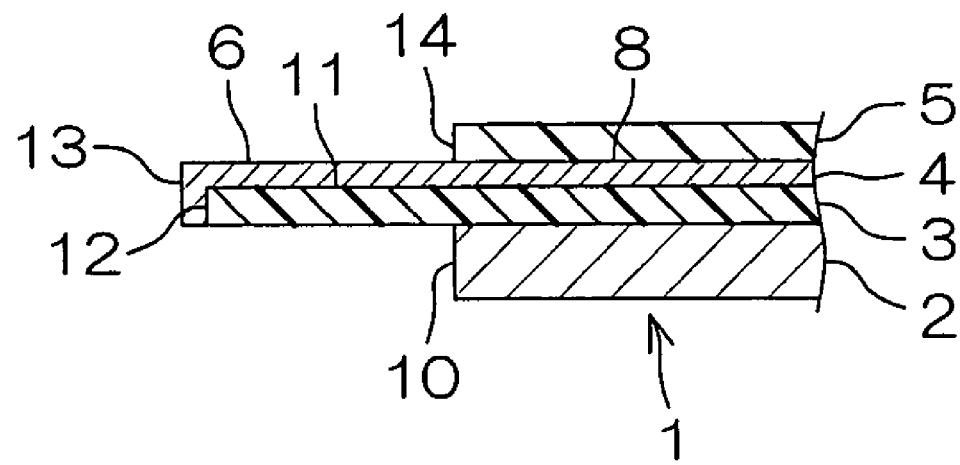
FIG. 5 is an enlarged view correspondent to FIG. 2, showing the principal portion of another embodiment (second embodiment) of the outer terminal portions shown in FIGS. 2, 5(a) showing a cross-sectional view along the longitudinal direction of the suspension board with circuit, and 5(b) showing a plan view thereof.
Figure 5:
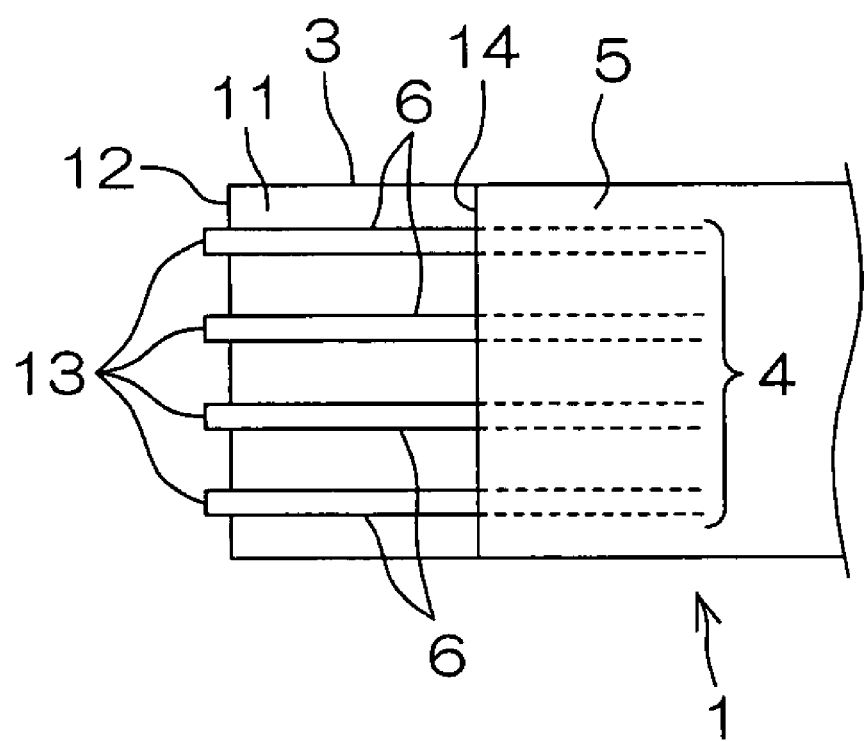

FIG. 5 is an enlarged view correspondent to FIG. 2, showing the principal portion of another embodiment (second embodiment) of the outer terminal portions shown in FIG. 2,: (a) showing a cross-sectional view along the longitudinal direction of the suspension board with circuit, and (b) showing a plan view thereof. In FIG. 5, the description of the same components as described above is omitted by denoting the same reference numerals.

Next, referring to FIG. 5, the suspension board with circuit according to the second embodiment of the present invention is described. In the suspension board with circuit 1 according to the first embodiment described above, the front end surface 13 of each of the outer terminal portions 6 is formed to be generally flush with the front end surface 12 of the terminal supporting portion 11. In contrast, in the suspension board with circuit 1 according to the second embodiment, as shown in FIG. 5, the front end surface 13 of each of the outer terminal portions 6 is formed to a position anterior to the front end surface 12 of the terminal supporting portion 11 in such a manner as to cover the front end surface 12 of the terminal supporting portion 11.

Specifically, each of the outer terminal portions 6 has the front end portion thereof formed in an L-shape when viewed in side section in continued relation to the surface (upper surface) of the terminal supporting portion 11 and to the front end surface 12 thereof to cover the front end surface 12 of the terminal supporting portion 11. Consequently, the front end surface 13 of each of the outer terminal portions 6 covers, from the front, the front end surface 12 of the terminal supporting portion 11 facing each of the outer terminal portions In the suspension board with circuit 1 according to the second embodiment, the front end surface 12 of the terminal supporting portion 11 is covered with the front end surface 13 of each of the outer terminal portions 6. Accordingly, when the outer terminal portions 6 are connected to the respective connecting terminal portions 22, the areas of the contact points at the outer terminal portions 6 with the connecting terminal portions 22 can be increased without changing the thicknesses of the outer terminal portions 6 and the terminal supporting portion 11, as is described later. This allows easy alignment between the individual outer terminal portions 6 and the individual connecting terminal portions 22, precise connection of the connecting portions, and an improvement in the connection reliability of the connecting potions.

The suspension board with circuit 1 according to the second embodiment can be formed in accordance with the method for manufacturing the suspension board with circuit 1 according to the first embodiment.

However, when the conductive pattern 4 is formed by an additive method, the plating resist 15 is provided to be apart from the front end surface 12 of the terminal supporting portion 11 by a thickness (e.g., 5 to 50 µm) necessary for the formation of the front end surfaces 13 of the outer terminal portions 6, as indicated by the broken line of FIG. 3(*d*). As a result, the front end portion of each of the outer terminal portions 6 is formed in continued relation to the surface (upper surface) of the terminal supporting portion 11 and the front end surface 12 thereof to cover the front end surface 12 of the terminal supporting portion 11, as shown in FIG. 5(*a*).

Figure 6:
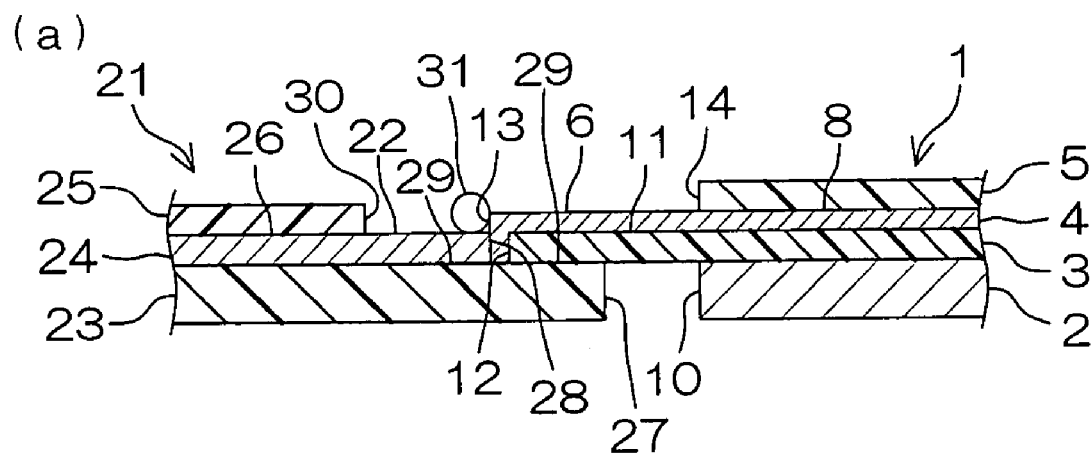
FIG. 6 is a cross-sectional view showing the principal portion of the connection structure between each of the outer terminal portions of the suspension board with circuit shown in FIG. 5 and each of the connecting terminal portions of the external wired circuit board, 6(a) showing a cross-sectional view along the longitudinal direction of the suspension board with circuit, and 6(b) showing a plan view thereof.
Figure 6:
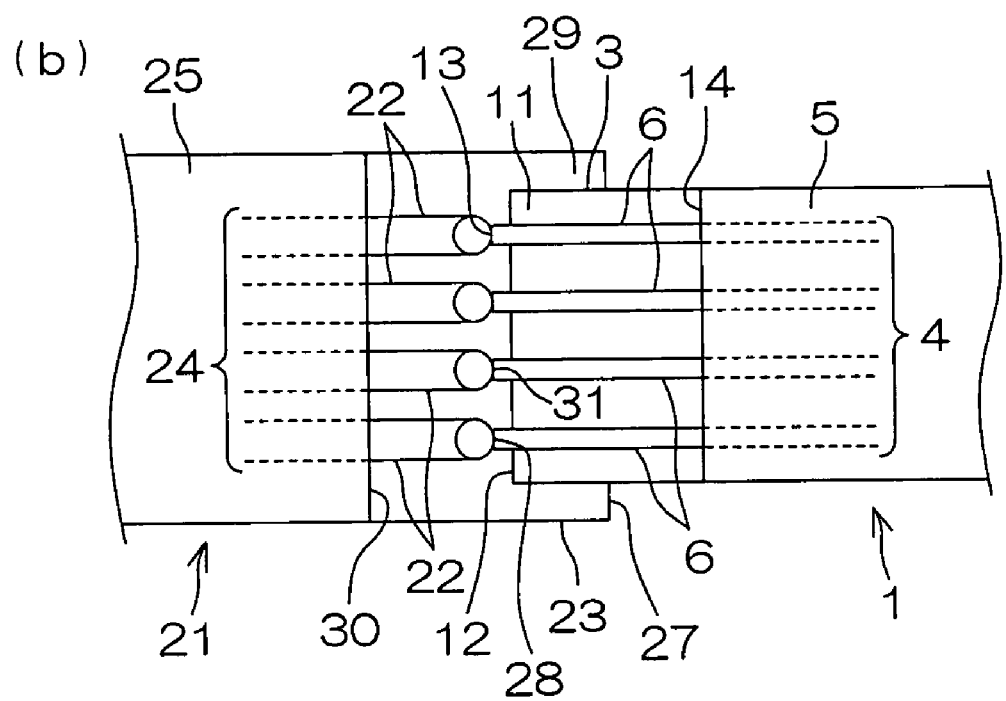

FIG. 6 is a cross-sectional view showing the principal portion of the connection structure between each of the outer terminal portions of the suspension board with circuit shown in FIG. 5 and each of the connecting terminal portions of the external wired circuit board,: 6(*a*) showing a cross-sectional view along the longitudinal direction of the suspension board with circuit, and 6(*b*) showing a plan view thereof. In FIG. 6, the description of the same components as described above is omitted by denoting the same reference numerals.

Next, referring to FIG. 6, a description is given to the connection structure between each of the outer terminal portions 6 of the suspension board with circuit 1 according to the second embodiment and each of the connecting terminal portions 22 of the external wired circuit board 21.

The connection structure shown in FIG. 6 is the same as the connection structure shown in FIG. 4 except that the respective front end surfaces 13 of the outer terminal portions 6 covering the front end surface 12 of the terminal supporting portion 11 and the respective rear end surfaces 28 of the connecting terminal portions 22 are brought into contact with each other in abutting relation.

In the connection structure shown in FIG. 6, the respective front end surfaces 13 of the outer terminal portions 6 covering the front end surface 12 of the terminal supporting portion 11 are in contact with the respective rear end surfaces 28 of the connecting terminal portions 22. As a result, the area of each of the contact points at the outer terminal portions 6 with the connecting terminal portions 22 can be increased without changing the thicknesses of the outer terminal portions 6 and the terminal supporting portion 11. This allows easy alignment between the individual outer terminal portions 6 and the individual connecting terminal portions 22, precise connection of the connecting portions, and an improvement in the connection reliability of the connecting potions.

Since the outer terminal portions 6 are in direct contact with the connecting terminal portions 22, the degradation of the electric connection between the outer terminal portions 6 and the connecting terminal portions 22 can be prevented even when the conductivity of the solder balls 31 deteriorates.

Figure 7:
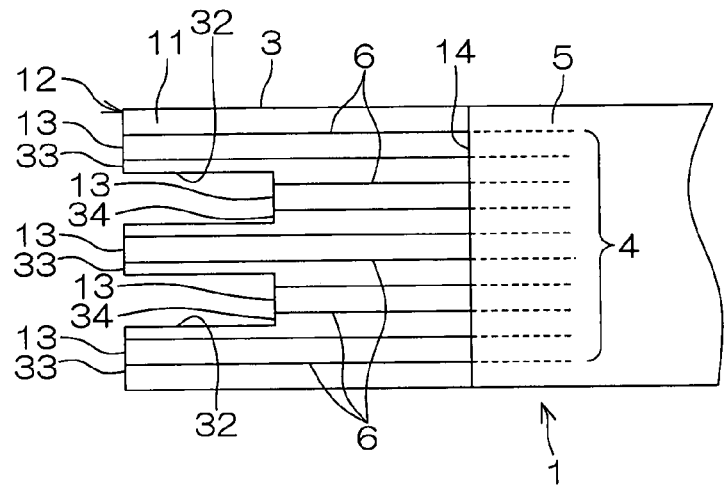
FIG. 7 is an enlarged plan view correspondent to FIG. 2, showing the principal portion of still another embodiment (third embodiment) of the outer terminal portions shown in FIG. 2.
Figure 8:
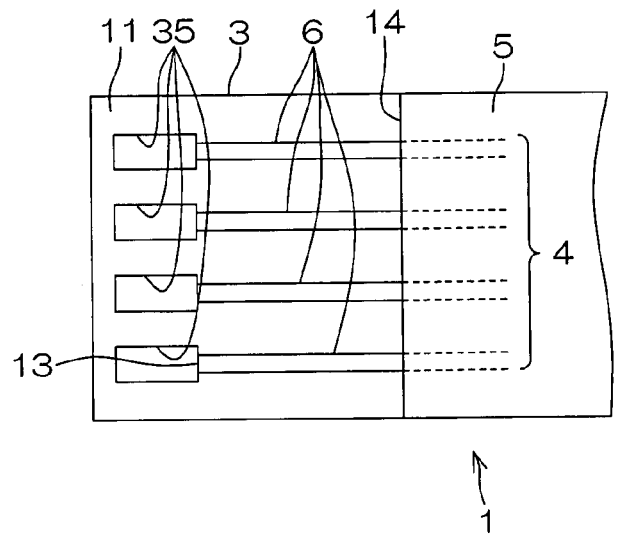
FIG. 8 is an enlarged plan view correspondent to FIG.

FIG. 7 is an enlarged plan view correspondent to FIG. 2, showing the principal portion of still another embodiment (third embodiment) of the outer terminal portions shown in FIG. 2. FIG. 8 is an enlarged plan view correspondent to FIG. 2, showing the principal portion of yet another embodiment (fourth embodiment) of the outer terminal portions shown in FIG. 2. FIG. 9 is an enlarged plan view correspondent to FIG. 2, showing the principal portion of still another embodiment (fifth embodiment) of the outer terminal portions shown in FIG. 2. FIG. 10 is an enlarged plan view correspondent to FIG. 2, showing the principal portion of yet another embodiment (sixth embodiment) of the outer terminal portions shown in FIG. 2. FIG. 11 is an enlarged plan view correspondent to FIG. 2, showing the principal portion of still another embodiment (seventh embodiment) of the outer terminal portions shown in FIG. 2. In FIGS. 7 to 11, the description of the same components as described above is omitted by denoting the same reference numerals.

Next, referring to FIGS. 7 to 11, a description is given to wired circuit boards according to the various embodiments of the present invention.

As shown in FIG. 7, in the suspension board with circuit 1 according to the third embodiment, the terminal supporting portion 11 of the insulating base layer 3 has the front end surface 12 thereof formed in an uneven shape along the longitudinal direction. More specifically, the terminal supporting portion 11 of the insulating base layer 3 has the front end portion thereof formed with two recessed portions 32 which are retracted in front-to-rear directions in widthwise spaced apart relation. Consequently, the front end surface 12 is divided into three anterior front end surfaces 33, which are located on both widthwise sides and at the widthwise center, and two posterior front end surfaces 34, which are located posterior to the anterior front end surfaces 33 and alternately interposed between the anterior front end surfaces 33.

In the suspension board with circuit 1 according to the third embodiment, five wires 8 and five outer terminal portions 6 corresponding thereto are formed in widthwise spaced apart relation. Of the five outer terminal portions 6, three are formed on both widthwise sides and at the widthwise center such that the front end surfaces 13 thereof are generally flush with the anterior front end surfaces 33. On the other hand, the other two outer terminal portions 6 are formed alternately between the three outer terminal portions 6 shown above such that the front end surfaces 13 thereof are generally flush with the posterior front end surfaces 34.

As shown in FIG. 8, in the suspension board with circuit 1 according to the fourth embodiment, a plurality of (four) openings 35 corresponding to the respective outer terminal portions 6 are formed in the terminal supporting portion 11 of the insulating base layer 3. Each of the openings 35 is formed midway in the longitudinal direction of the terminal supporting portion 11 to have a generally rectangular shape when viewed in plan view, and arranged in parallel in mutually spaced apart relation in the widthwise direction. The respective outer terminal portions 6 extend toward the respective openings 35 such that the front end portions 13 thereof are generally flush with the respective rear end surfaces of the openings 35.

As shown in FIG. 9, the suspension board with circuit 1 according to the fifth embodiment is different from the suspension board with circuit 1 according to the fourth embodiment in that the respective front end surfaces 13 of the outer terminal portions 6 cover the respective rear end surfaces of the openings 35.

As shown in FIG. 10, the suspension board with circuit 1 according to the sixth embodiment is different from the suspension board with circuit 1 according to the fifth embodiment in that the respective openings 35 are widthwise arranged in a staggered pattern. More specifically, the two forward-positioned openings 35 and the two rear-positioned openings 35 are alternately arranged in the widthwise direction.

As shown in FIG. 11, the suspension board with circuit 1 according to the seventh embodiment is different from the suspension board with circuit 1 according to the sixth embodiment in that the two forward-positioned openings 35 are disposed on both widthwise sides and the two rear-positioned openings 35 are disposed between the two forward-positioned openings 35.

In the description given above, the front end surface 14 of the insulating cover layer 5 are formed to be generally flush with the front end surface 10 of the metal supporting board 2. However, the pattern of the insulating cover layer 5 is not limited to that shown above as long as the insulating cover layer 5 can cover each of the wires 8, and expose each of the outer terminal portions 6 and the magnetic-head-side terminal portions 7. It is also possible to obviate the necessity for the insulating cover layer 5 depending on the purpose and application thereof.

Although the wired circuit board according to the present invention has been described above using the suspension board with circuit 1 as an example, the wired circuit board according to the present invention is not limited to the suspension board with circuit and includes various wired circuit boards such as a flexible wired circuit board and a rigid wired circuit board.

EXAMPLES

The present invention is described more specifically by showing the examples thereof hereinbelow. However, the present invention is by no means limited to the examples.

Example 1

(Formation of Suspension Board with Circuit)

A metal supporting board made of a stainless steel foil having a width of 300 mm and a thickness of 20 μm was prepared (see FIG. 3(a)). Then, a photosensitive polyamic acid resin solution (varnish) was coated on a surface of the metal supporting board and dried. The dried coating was exposed to light via a photomask, heated after exposure, developed in an alkaline developer solution, and then heated to be cured, thereby forming a insulating base layer made of a polyimide resin having a thickness of 10 μm (see FIG. 3(b)).

The insulating base layer was formed as a terminal supporting portion at the area of the front end portion to be provided with outer terminal portions, while it was formed at the area of the rear end portion to be provided with the magnetic-head-side terminal portions. Between the front end portion and the rear end portion, the insulating base layer was formed in a pattern in which the segments of the insulating base layer were formed on both widthwise sides of the metal supporting board in mutually spaced apart relation.

Then, a chromium thin film having a thickness of 300 Å and a copper thin film having a thickness of 700 Å were formed successively over the entire surface of the insulating base layer by sputtering deposition to form a conductive thin film.

Then, a plating resist was formed in a pattern reverse to a conductive pattern on the conductive thin film using a dry film resist (see FIG. 3(c)). Thereafter, the conductive pattern having a thickness of 10 μm was formed by electrolytic copper plating on the conductive thin films exposed from the plating resist (see FIG. 3(d)). Subsequently, the plating resist was removed by wet etching, and then the metal thin films were removed from the portion on which the plating resist was formed by peeling them off (see FIG. 3(e)).

In this manner, the conductive pattern was formed as a pattern comprising the plurality of wires formed on both widthwise ends on the insulating base layer between the front end portion and the rear end portion, the plurality of outer terminal portions formed on the terminal supporting portion of the insulating base layer at the front end portion, and the plurality of magnetic-head-side terminal portions formed on the insulating base layer at the rear end portion.

Each of the outer terminal portions had a length of 1 mm and a width of 30 μm. The widthwise spacing between the individual outer terminal portions was 30 μm.

Then, a photosensitive polyamic acid resin solution (varnish) was coated on the insulating base layer to cover the conductive pattern and dried. The dried coating was exposed to light via a photomask, developed in an alkaline developer solution, and then heated to be cured, thereby forming a insulating cover layer made of a polyimide resin having a thickness of 4 μm (see FIG. 3(f)).

The insulating cover layer was formed in a pattern in which the outer terminal portions and the terminal supporting portion were exposed therefrom at the front end portion, the magnetic-head-side terminal portions were exposed therefrom at the rear end portion, and the wires were covered therewith between the front end portion and the rear end portion.

Next, the metal supporting board was subjected to wet etching so that a gimbal was formed and the outer terminal portions and the terminal supporting portion were exposed from the metal supporting board (see FIG. 3(g)). The terminal supporting portion exposed from the metal supporting board had a length of 1 mm and a width of 1.5 mm.

Then, electroless nickel plating and electroless gold plating were performed successively with respect to the outer terminal portions and the magnetic-head-side terminal portions each exposed from the insulating cover layer to form a metal plating layer made of a nickel plating layer, a gold plating layer and having a thickness of 2 μm, whereby the suspension board with circuit was obtained.

(Connection between External Wired Circuit Board and Suspension Board with Circuit)

An external wired circuit board was prepared which comprises a insulating base layer made of polyimide having a thickness of 25 μm (with a supporting portion having a length of 0.5 mm and a width of 2 mm), a conductive pattern made of a copper foil formed on the insulating base layer, having a thickness of 18 μm (with connecting terminal portions each having a length of 1 mm and a width of 30 μm, and having a spacing of 30 μm therebetween), and a insulating cover layer made of polyimide formed to cover the conductive pattern, having a thickness of 15 μm.

Then, the terminal supporting portion of the insulating base layer of the suspension board with circuit was placed on the supporting portion of the insulating base layer of the external wired circuit board, while the front end surface of the terminal supporting portion of the suspension board with circuit was disposed to face and come into contact with the front end surface of each of the connecting terminal portions of the external wired circuit board along the longitudinal direction.

Then, solder balls were placed on the respective rear end portions of the connecting terminal portions of the external wired circuit board, and melted such that the molten solder balls brought into contact with the respective surfaces of the connecting terminal portions of the external wired circuit board and with the respective front end surfaces of the outer terminal portions of the suspension board with circuit.

In this manner, the connecting terminal portions of the external wired circuit board were electrically connected to the outer terminal portions of the suspension board with circuit (see FIG. 4).

Example 2

(Formation of Suspension Board with Circuit)

A suspension board with circuit was obtained by the same method as used in the formation of the suspension board with circuit according to Example 1 except that, when the conductive pattern was formed by the additive method, the plating resist was provided to be apart from the front end surface of the terminal supporting portion by a thickness (15 μm) necessary for the formation of the front end surfaces of the outer terminal portions (see FIG. 5).

(Connection between External Wired Circuit Board and Suspension Board with Circuit)

The same external wired circuit board as used in Example 1 was prepared. Then, the terminal supporting portion of the insulating base layer of the suspension board with circuit was placed on the supporting portion of the insulating base layer of the external wired circuit board, while the front end surface of each of the outer terminal portions of the suspension board with circuit was disposed to face and come into contact with the front end surface of each of the connecting terminal portions of the external wired circuit board along the longitudinal direction.

Then, solder balls were placed on the respective rear end portions of the connecting terminal portions of the external wired circuit board, and melted such that the molten solder balls brought into contact with the respective surfaces of the connecting terminal portions of the external wired circuit board and with the respective front end surfaces of the outer terminal portions of the suspension board with circuit.

In this manner, the connecting terminal portions of the external wired circuit board were electrically connected to the outer terminal portions of the suspension board with circuit (see FIG. 6).

While the illustrative embodiments of the present invention are provided in the above description, such is for illustrative purpose only and it is not to be construed limitative. Modification and variation of the present invention that are obvious to those skilled in the art are to be covered by the following claims.

What is claimed is:

1. A wired circuit board comprising:
   a metal supporting layer made of stainless steel;
   an insulating layer formed on the metal supporting layer and comprising a terminal supporting portion which protrudes beyond a front end face of the metal supporting layer; and
   a conductive pattern formed on the insulating layer and having a terminal portion for connecting to an external terminal, wherein the terminal portion is disposed at an end portion of the conductive pattern, supported on the terminal supporting portion of the insulating layer, and exposed from the metal supporting layer to have an end surface thereof used as a point of contact with the external terminal, and wherein the end surface of the terminal portion is substantially flush with an end surface of the terminal supporting portion of the insulating layer supporting the terminal portion.

2. A wired circuit board according to claim 1, which is a suspension board with circuit.

3. A connection structure between wired circuit boards connecting a first wired circuit board to a second wired circuit board, the first wired circuit board comprising:
- a first metal supporting layer made of stainless steel;
- a first insulating layer formed on the first metal supporting layer and comprising a first terminal supporting portion which protrudes beyond a front end face of the first metal supporting layer; and
- a first conductive pattern formed on the first insulating layer and having a first terminal portion, wherein the first terminal portion is disposed at an end portion of the first conductive pattern, supported on the first terminal supporting portion of the first insulating layer, and exposed from the first metal supporting layer to have an end surface thereof used as a point of contact, and the second wired circuit board comprising:
- a second insulating layer; and
- a second conductive pattern formed on the second insulating layer and having a second terminal portion, wherein the first insulating layer of the first wired circuit board is disposed to face the second terminal portion of the second wired circuit board in a direction orthogonal to a layer thickness direction such that a lower surface of the first terminal supporting portion is disposed in the same plane as a lower surface of the second terminal portion of the second wired circuit board, and the end surface of the first terminal portion of the first wired circuit board is connected to a surface of the second terminal portion of the second wired circuit board via a molten metal.

4. A wired circuit board comprising:
- a metal supporting layer;
- an insulating layer formed on the metal supporting layer; and
- a conductive pattern formed on the insulating layer and having a terminal portion for connecting to an external terminal, wherein the terminal portion is disposed at an end portion of the conductive pattern, supported on the insulating layer, and exposed from the metal supporting layer to have an end surface thereof used as a point of contact with the external terminal, and wherein the end surface of the terminal portion covers an end surface of the insulating layer supporting the terminal portion.

5. A connection structure between wired circuit boards connecting a first wired circuit board to a second wired circuit board, the first wired circuit board comprising:
- a first metal supporting layer;
- a first insulating layer formed on the first metal supporting layer; and
- a first conductive pattern formed on the first insulating layer and having a first terminal portion, wherein the first terminal portion is disposed at an end portion of the first conductive pattern, supported on the first insulating layer, and exposed from the first metal supporting layer to have an end surface thereof used as a point of contact, and the second wired circuit board comprising:
- a second insulating layer; and
- a second conductive pattern formed on the second insulating layer and having a second terminal portion, wherein the first insulating layer of the first wired circuit board is disposed to face the second terminal portion of the second wired circuit board in a direction orthogonal to a layer thickness direction, and the end surface of the first terminal portion of the first wired circuit board is connected to a surface of the second terminal portion of the second wired circuit board via a molten metal, and wherein the end surface of the first terminal portion of the first wired circuit board is substantially flush with an end surface of the first insulating layer supporting the first terminal portion, and the end surface of the first insulating layer of the first wired circuit board is in contact with an end surface of the second terminal portion of the second wired circuit board.

6. A connection structure between wired circuit boards connecting a first wired circuit board to a second wired circuit board, the first wired circuit board comprising:
- a first metal supporting layer;
- a first insulating layer formed on the first metal supporting layer; and
- a first conductive pattern formed on the first insulating layer and having a first terminal portion, wherein the first terminal portion is disposed at an end portion of the first conductive pattern, supported on the first insulating layer, and exposed from the first metal supporting layer to have an end surface thereof used as a point of contact, and the second wired circuit board comprising:
- a second insulating layer; and
- a second conductive pattern formed on the second insulating layer and having a second terminal portion, wherein the first insulating layer of the first wired circuit board is disposed to face the second terminal portion of the second wired circuit board in a direction orthogonal to a layer thickness direction, and the end surface of the first terminal portion of the first wired circuit board is connected to a surface of the second terminal portion of the second wired circuit board via a molten metal, and wherein the end surface of the first terminal portion of the first wired circuit board covers an end surface of the first insulating layer supporting the first terminal portion, and the end surface of the first terminal portion of the first wired circuit board is in contact with an end surface of the second terminal portion of the second wired circuit board.

7. A connection structure between wired circuit boards connecting a first wired circuit board to a second wired circuit board, the first wired circuit board comprising:
- a first metal supporting layer;
- a first insulating layer formed on the first metal supporting layer; and
- a first conductive pattern formed on the first insulating layer and having a first terminal portion, wherein the first terminal portion is disposed at an end portion of the first conductive pattern, supported on the first insulating layer, and exposed from the first metal supporting layer to have an end surface thereof used as a point of contact, and the second wired circuit board comprising:
- a second insulating layer; and
- a second conductive pattern formed on the second insulating layer and having a second terminal portion, wherein the first insulating layer of the first wired circuit board is disposed to face the second terminal portion of the second wired circuit board in a direction orthogonal to a layer thickness direction, and the end surface of the first terminal portion of the first wired circuit board is connected to a surface of the second terminal portion of the second wired circuit board via a molten metal, and wherein the second insulating layer of the second wired circuit board protrudes toward the first metal supporting layer of the first wired circuit board more than the second terminal portion, and the first insulating layer of the first wired circuit board is supported on the second insulating layer of the second wired circuit board.

* * * * *